United States Patent
Lemke et al.

(10) Patent No.: US 9,251,934 B2
(45) Date of Patent: Feb. 2, 2016

(54) METHOD FOR MANUFACTURING A PLURALITY OF NANOWIRES

(71) Applicant: Infineon Technologies AG, Neubiberg (DE)

(72) Inventors: Marko Lemke, Dresden (DE); Stefan Tegen, Dresden (DE); Uwe Rudolph, Dresden (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 203 days.

(21) Appl. No.: 13/739,030

(22) Filed: Jan. 11, 2013

(65) Prior Publication Data
US 2014/0197130 A1    Jul. 17, 2014

(51) Int. Cl.
*H01L 21/3065* (2006.01)
*B82Y 40/00* (2011.01)
*H01B 13/00* (2006.01)
*C01B 31/02* (2006.01)

(52) U.S. Cl.
CPC ............... *H01B 13/00* (2013.01); *C01B 31/02* (2013.01); *H01L 21/3065* (2013.01); *B82Y 40/00* (2013.01)

(58) Field of Classification Search
None
See application file for complete search history.

(56) References Cited

U.S. PATENT DOCUMENTS

| | | | |
|---|---|---|---|
| 7,182,812 B2 * | 2/2007 | Sunkara et al. | 117/103 |
| 2007/0118938 A1* | 5/2007 | Sunkara et al. | 977/811 |
| 2008/0044732 A1* | 2/2008 | Salot et al. | 429/322 |
| 2009/0042102 A1* | 2/2009 | Cui et al. | 429/231.95 |
| 2013/0093122 A1* | 4/2013 | Schulz et al. | 264/465 |

FOREIGN PATENT DOCUMENTS

KR    2010-0097859 A  *  9/2010

OTHER PUBLICATIONS

"3-D Integrated All-Solid-State Rechargeable Batteries", Notten et al., Adv. Mater. 2007, p. 4564-4567.
"Anomalous Shape Changes of Silicon Nanopillars by Electrochemical Lithiation", Lee et al., Nano Letters, May 26, 2011, pp. A-F.
"State of Solid-State Batteries", Prof. Kevin S. Jones, Department of Materials Science and Engineering, University of Florida, SWAMP Software and Analysis of Advanced Materials Processing Center; p. 1-60.
"Investigation of Metal-assisted Si Etching for Fabrication of Nanoimprint Lithography Stamps", Ksenia Anokhina, Technical Report, IDE 1056, Oct. 2010; p. 1-54.
"Fabrication of nanowires with high aspect ratios utilized by dry etching with SF6:C4F8 and self-limiting thermal oxidation on Si substrate", Park et al., J. Vac. Sci. Technol. B, vol. 28, No. 4, Jul./Aug. 2010, p. 763-768.
"Three-dimensional Microbatteries for Mems/Nems Technology", Dunn et al., Department of Materials Science and Engineering, Mechanical and Aerospace Engineering Department, Department of Chemistry and Biochemistry, University of California, Los Angeles (UCLA) U.S.A., p. 164-167.
Tom's Hardware: Zehnmal bessere Akkus in Aussicht ("Batteries with ten times the capacity to come"), Thomas Kretschmann, Dec. 21, 2007.

(Continued)

*Primary Examiner* — Anita Alanko

(57) ABSTRACT

A method for manufacturing a plurality of nanowires, the method including: providing a carrier comprising an exposed surface of a material to be processed and applying a plasma treatment on the exposed surface of the material to be processed to thereby form a plurality of nanowires from the material to be processed during the plasma treatment.

25 Claims, 10 Drawing Sheets

(56) References Cited

OTHER PUBLICATIONS

Abstract of Tom's Hardware: Zehnmal bessere Akkus in Aussicht ("Batteries with ten times the capacity to come"), Thomas Kretschmann, Dec. 21, 2007.

Drahtiges Silizium (Wiry Silicon), Matthias Graebner, Telepolis, Dec. 22, 2007.

Abstract of Drahtiges Silizium (Wiry Silicon), Matthias Graebner, Telepolis, Dec. 22, 2007.

* cited by examiner

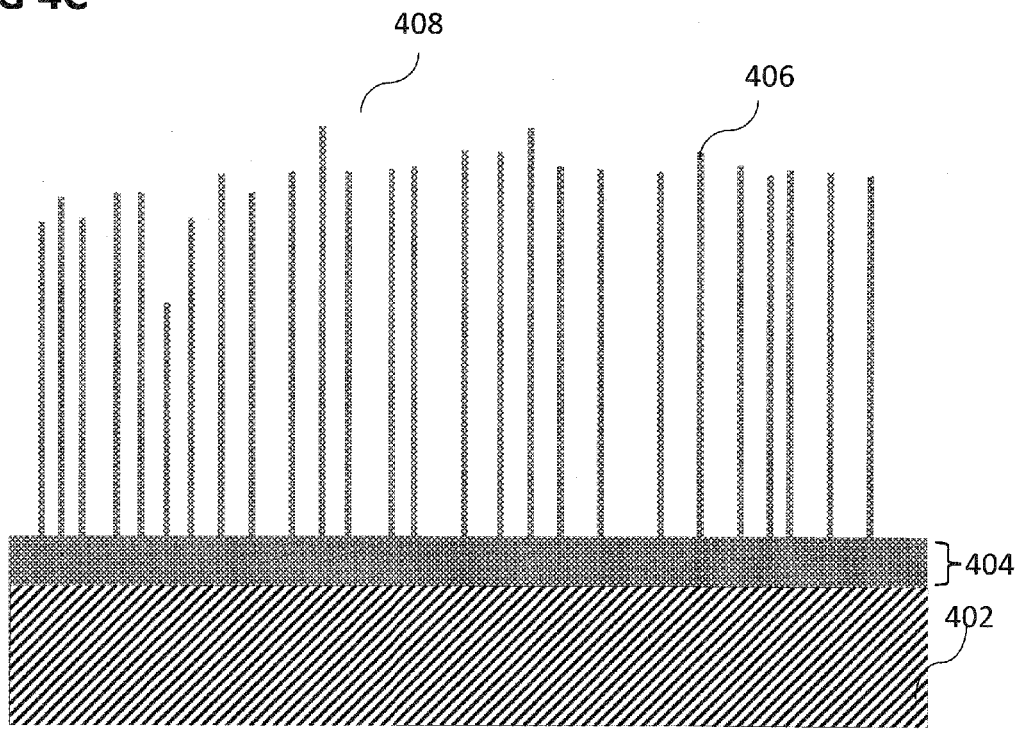

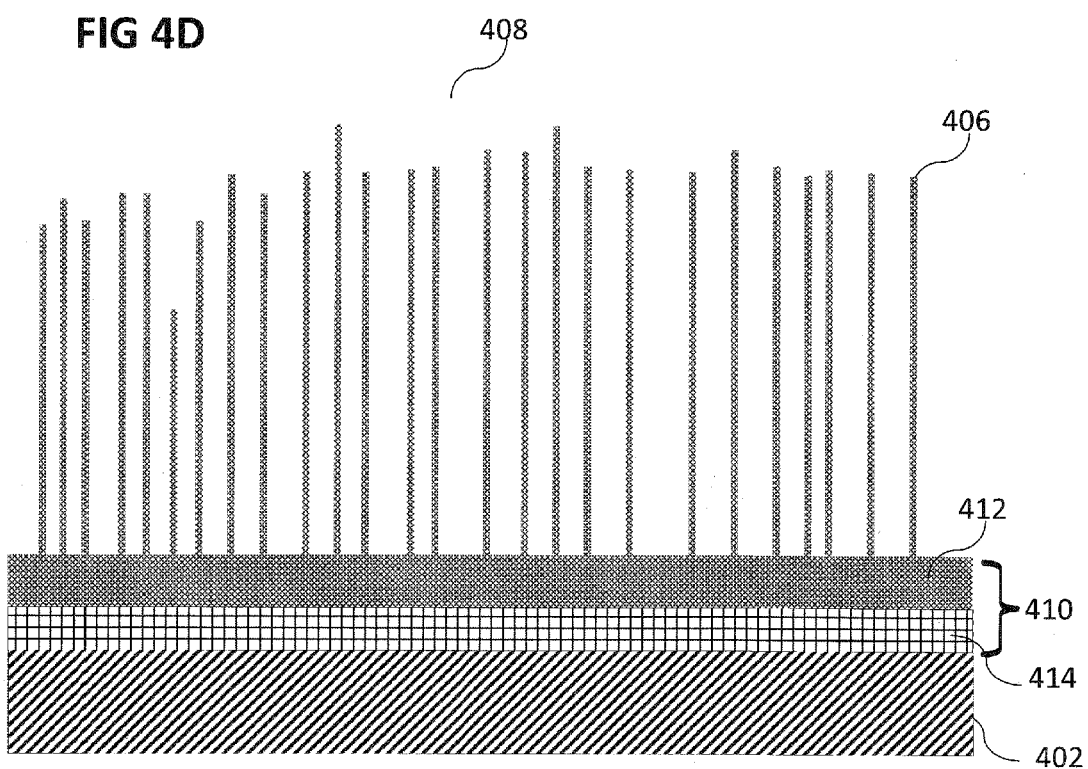

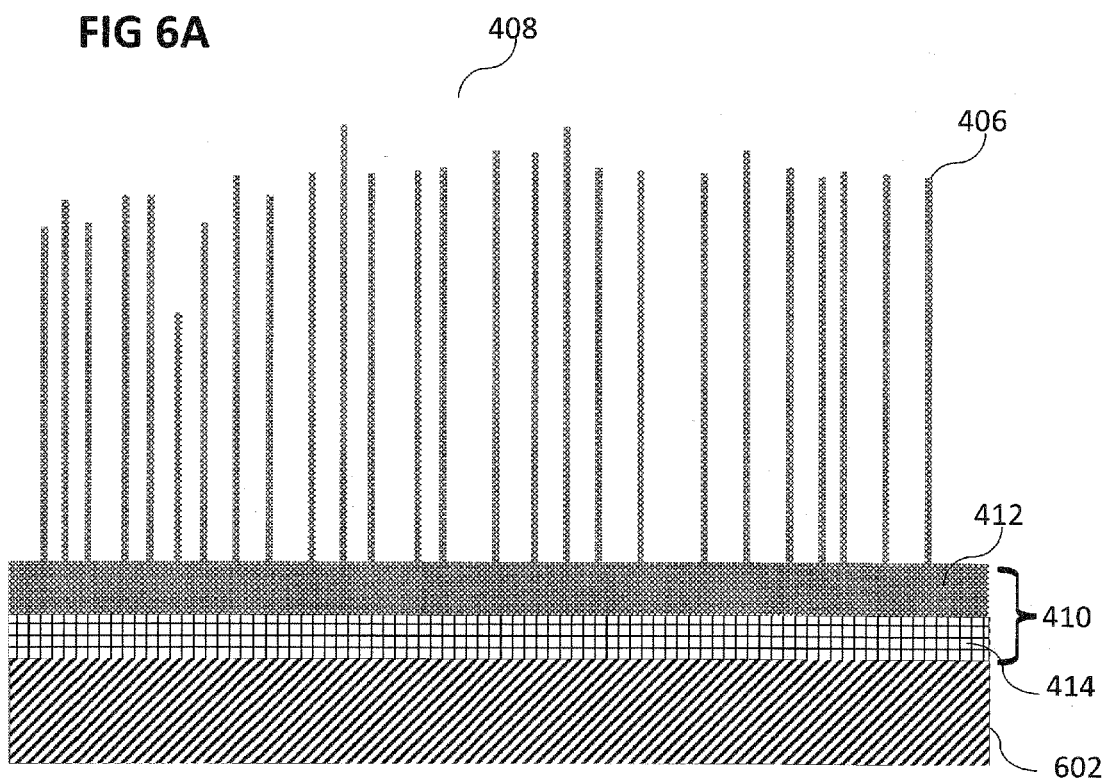

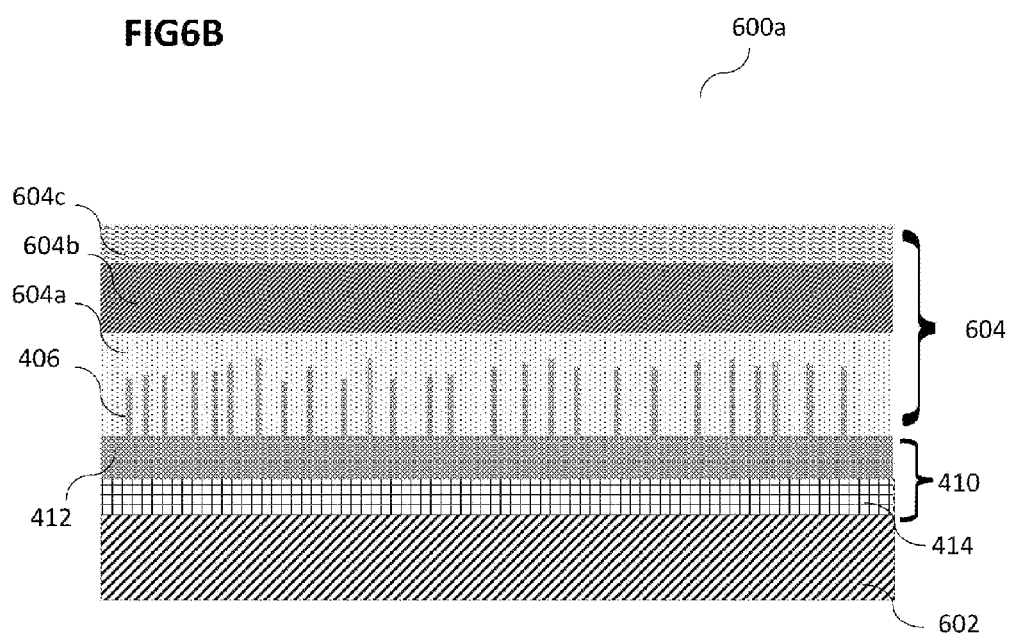

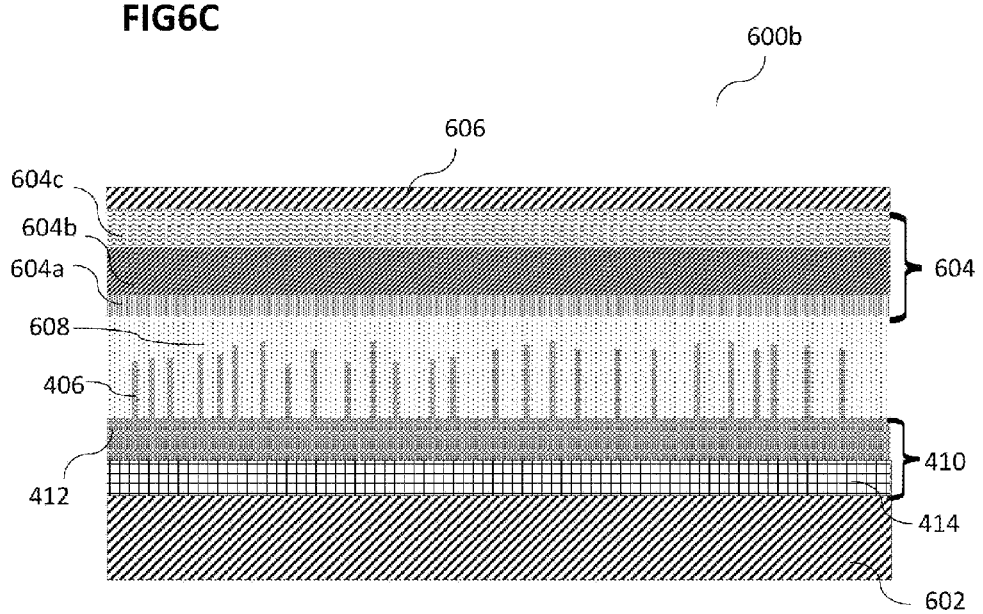

METHOD FOR MANUFACTURING A PLURALITY OF NANOWIRES

TECHNICAL FIELD

Various embodiments generally relate to a method for manufacturing a plurality of nanowires.

BACKGROUND

Creating nanostructures or nanowires may be in general very challenging and therefore, complex processes may be utilized for manufacturing nanostructures or nanowires. Typically involved processes using for example lithography and basic processes in semiconductor industry may be limited to a minimum feature size of the respectively involved lithographic processes and etch processes. Nanowires may be the first choice for many technical applications, since they provide unique properties due to their low dimensionality or due to their small spatial extension.

SUMMARY

In various embodiments, a method for manufacturing a plurality of nanowires is provided, wherein the method may include: providing a carrier including an exposed surface of a material to be processed; and applying a plasma treatment on the exposed surface of the material to be processed to thereby form a plurality of nanowires from the material to be processed during the plasma treatment.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIGS. 4A to 4D show cross-sectional views of a processed carrier at various processing stages respectively, according to various embodiments;

FIGS. 6A to 6C show cross-sectional views of a processed carrier at various processing stages respectively, while manufacturing a battery including a plurality of nanowires, according to various embodiments.

DESCRIPTION

Figure 1:
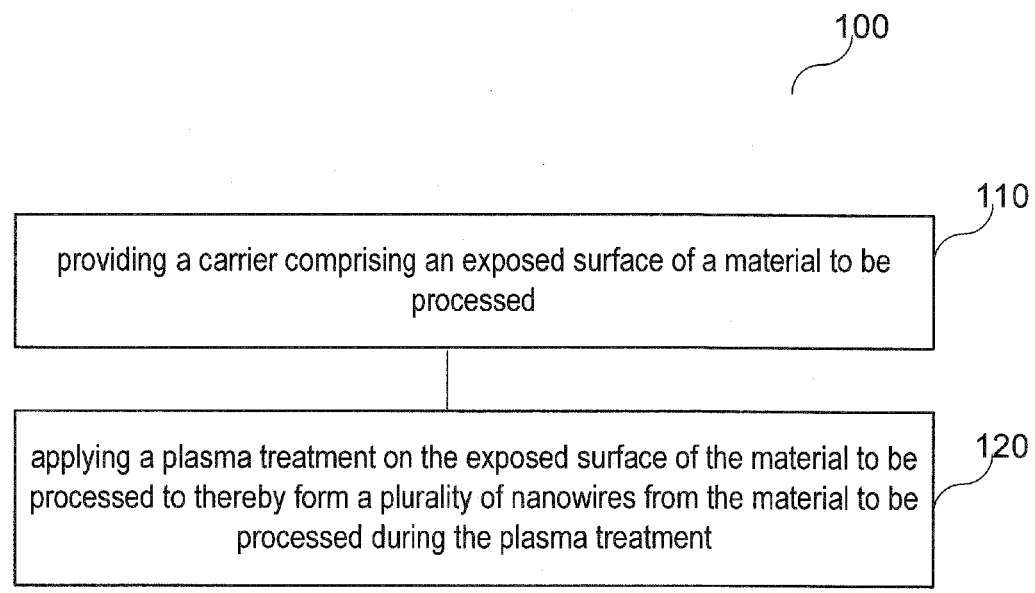
FIG. 1 shows a method for manufacturing a plurality of nanowires in a flow diagram, according to various embodiments.

The following detailed description refers to the accompanying drawings that show, by way of illustration, specific details and embodiments in which the invention may be practiced.

The word "over" used with regards to a deposited material formed "over" a side or surface (or a carrier), may be used herein to mean that the deposited material may be formed "directly on", e.g. in direct contact with, the implied side or surface (or the carrier). The word "over" used with regards to a deposited material formed "over" a side or surface (or a carrier), may be further used herein to mean that the deposited material may be formed "indirectly on" the implied side or surface (or carrier) with one or more additional layers being arranged between the implied side or surface (or carrier) and the deposited material.

The term "height" used with regards to a height of a structure (or a height a nanostructure), may be used herein to mean an extension of a structure (or a nanostructure) along a direction perpendicular to the surface of a carrier. Therefore, a surface of a carrier (or the main processing surface of a wafer) may be used as reference.

A length, a height, a diameter, or an aspect ratio which may be described herein having a dimension of about a certain value may also have exactly the dimension of the certain value, according to various embodiments.

Manufacturing silicon nanowires by commonly used processes including patterning processes may be too expensive, too slow, or too unreliable for the use in many applications. As for example, silicon nanowires have proven to be suitable to store a large amount of lithium-ions by intercalation without being structurally damaged by the incorporation of lithium-ions, and therefore, silicon nanowires may be used as an electrode material in a lithium-ion based battery. In contrast, silicon bulk material may degrade while lithium-ions are repeatedly incorporated into the interstitials of the silicon lattice (e.g. during a certain number of charge and discharge cycles of a lithium-ion based battery), since the volume expansion of silicon lattice may be up to 400% during intercalation of lithium-ions resulting in the degradation of single crystalline silicon to silicon powder, wherein silicon powder may be therefore not suitable to function as an electrode in a battery.

According to various embodiments, a method for creating a plurality of nanostructures is provided. In the following, the created nanostructures are described as nanowires, wherein, according to various embodiments, the term nanowires used herein may also include nanopillars, nanotubes, or nanostructures with another shape than wires or tubes (e.g. with an irregular shape). Referring to this, a nanostructure, as described herein, may be a structure having the features of a high aspect ratio and a small lateral extension in the nanometer range (e.g. between 1 nm and 1 µm), and therefore, the shape of the nanostructure may be similar to a wire or a pillar and is referred to as nanowire in the following description. Since the length of a nanowire may be larger than 1 µm, a nanowire may be defined by the size of the diameter, which may be smaller than 1 µm (e.g. in the nanometer range), according to various embodiments. According to various embodiments, if the base area of a nanostructure or a nanowire does not have a circular shape, the diameter may be represented by the largest distance between two points on the edge of base area or if the nanostructure or a nanowire may have an irregular shape, the diameter may be represented by an arithmetically averaged diameter.

According to various embodiments, a structure referred to as a nanostructure having a high aspect ratio means, that an extension of the structure in one direction may be much larger than in another direction and that at least one extension may be in the nanometer range (e.g. two extensions may be in the nanometer range, or the diameter of a structure may be in the nanometer range, e.g. smaller than about 1 µm). In the case of a nanowire (or a nanopillar), the aspect ratio may be the ratio between the length of the nanowire (or the nanopillar) and the diameter of the nanowire (or the nanopillar), e.g. the ratio between length and diameter may be larger than 5, e.g. larger than 10, e.g. larger than 20. The ratio between length and diameter may be in the range from 5 to 100, e.g. the ratio between length and diameter may be in the range from about 20 to about 50, according to various embodiments.

According to various embodiments, a material or a material layer may be formed during a layering process described in the following. Forming a layer (e.g. depositing a layer, e.g. depositing a material, e.g. using a layering process), as referred to in the following description, may also include forming a layer, wherein the layer may include various sublayers, whereby different sublayers may include different materials respectively. In other words, various different sublayers may be included in a layer, or various different regions may be included in a deposited layer or in a deposited material.

In a layering process, as referred to in the following description, a material may be deposited forming a layer over a surface (e.g. over a surface of a carrier, over a surface of a wafer, over a surface of a substrate, over another layer, or the like) using deposition techniques which may include chemical vapor deposition (CVD, or a CVD process) or physical vapor deposition (PVD, or a PVD process), according to various embodiments. According to various embodiments, the thickness of a deposited layer may be in the range of a few nanometers (e.g. 5 nm to 20 nm, e.g. 2 nm to 100 nm, e.g. up to 500 nm) up to several micrometers (e.g. up to 2 μm or even more) depending on its specific function. Further, according to various embodiments, a layer may include at least one of an electrically insulating material, an electrically semiconducting material, and an electrically conductive material, depending on the respective specific function of the layer. According to various embodiments, conductive materials, as for example aluminium, aluminium-silicon alloys, aluminium-copper alloys, nichrome (an alloy of nickel, chromium, and/or iron), tungsten, titanium, titanium nitride (or other transition metal nitrides), molybdenum, or gold (or the like), may be deposited using CVD or PVD. According to various embodiments, semiconducting materials, as for example silicon, germanium, a semiconductor compound material such as gallium arsenide (GaAs), indium phosphide (InP), or indium gallium arsenide (InGaAs) may be deposited using CVD. Insulating materials, as for example silicon oxide or silicon nitride (or the like) may be deposited using CVD or PVD. According to various embodiments, modifications of these processes may be used as described in the following.

According to various embodiments, a chemical vapor deposition process (CVD process) may include a variety of modifications, as for example atmospheric pressure CVD (APCVD), low pressure CVD (LPCVD), ultrahigh vacuum CVD (UHVCVD), plasma enhanced CVD (PECVD), high density plasma CVD (HDPCVD), remote plasma enhanced CVD (RPECVD), atomic layer CVD (ALCVD), vapor phase epitaxy (VPE), metal organic CVD (MOCVD), hybrid physical CVD (HPCVD), and the like. According to various embodiments, polysilicon, silicon dioxide, silicon nitride, LiPON, $LiCoO_2$ and the like may be deposited using LPCVD (or ALD, ALCVD), but also molybdenum, tantalum, titanium, titanium nitride, nickel, tungsten, and the like may be deposited using LPCVD (or ALD, ALCVD). According to various embodiments, thin layers (e.g. layers having a thickness less than 50 nm) may be deposited using atomic layer deposition (ALD, ALCVD), in particular if a smooth unified layer surface is desired, e.g. for depositing a diffusion bather layer or thin layers for current transport.

According to various embodiments, physical vapor deposition may include a variety of modifications, as for example magnetron sputtering, ion-beam sputtering (IBS), reactive sputtering, high-power impulse magnetron sputtering (HIPIMS), vacuum evaporation, molecular beam epitaxy (MBE), and the like.

According to various embodiments, a doping process may be applied to change the physical properties of a material by adding dopant material, wherein the key aspects may be the electronic properties of the doped material (e.g. the specific electrical conductivity). According to various embodiments, various techniques may be applied or adapted to perform a doping process, as for example thermal diffusion and/or ion implantation. Doping may serve to generate regions in a carrier (in a wafer, in a substrate, in a layer, or in a nanostructure, e.g. a nanowire) being either rich in electrons (electron doping) or rich in holes (hole doping), wherein the electrons and holes may contribute to charge transport accordingly. Electron doping may be performed by implanting ions having more valence electrons than the solid state material (e.g. by implanting phosphor or arsenic into silicon e.g. by implanting phosphor or arsenic into silicon nanowires) and hole doping may be performed by implanting ions having less valence electrons than the solid state material (e.g. by implanting boron into silicon, e.g. by implanting boron into silicon nanowires). Further, electron doped material may be called n-type (negative-type) and hole doped material may be called p-type (positive type). According to various embodiments, thermal diffusion and ion implantation may be used for doping a material (or doping a carrier, or doping a nanowire).

According to various embodiments, in a thermal diffusion process, dopant material may be provided to diffuse into the material (e.g. a gaseous dopant material may be provided over or near a surface of a material), wherein the material may be heated up (e.g. to about 1000° C.) to support diffusion processes, according to various embodiments.

According to various embodiments, after implanting ions a thermal annealing process (e.g. rapid thermal annealing) may be carried out to create homogenous doping regions and/or to recover the crystal structure from ion damages.

FIG. 1 shows in a flow diagram a method 100 for manufacturing a plurality of nanowires, according to various embodiments, wherein the method includes providing a carrier including an exposed surface of a material to be processed (in 110), and applying a plasma treatment on the exposed surface of the material to be processed to thereby form a plurality of nanowires from the material to be processed during the plasma treatment (in 120).

According to various embodiments, the provided carrier may be a substrate or a wafer, wherein the carrier (substrate, wafer) may be made of semiconductor materials of various types, including silicon, germanium, Group III to V or other types, including polymers, for example, although in another embodiment, other suitable materials can also be used. In an embodiment, the wafer substrate is made of silicon (doped or undoped), in an alternative embodiment, the wafer substrate is a silicon on insulator (SOI) wafer. As an alternative, referring to method 300 as described in the following, any other suitable material can be used as carrier, for example semiconductor compounds, a metal (e.g. a metal tape), a metal alloy (e.g. a metal alloy tape), a polymer, or a mold material. According to various embodiments, the carrier may also include a printed circuit board or an integrated circuit.

Further, according to various embodiments, the carrier may be a metal substrate, or metal alloy substrate (e.g. a metal tape, e.g. a metal alloy tape), a polymer carrier, a carrier made of any suitable inorganic or organic material, wherein the carrier may be covered with a layer of the material to be processed. In other words, a layer of a material to be processed, which forms the nanowires after method 100 has been carried out, may be deposited over, any kind of substrate, carrier, or wafer, according to various embodiments. According to various embodiments, a layer of a material to be processed may include a semiconductor material, as for example silicon or germanium. According to various embodiments, a layer of a material to be processed may also include a layer stack of various materials, e.g. a layer stack of various semiconductor materials, e.g. a layer stack including at least one of silicon and germanium. The layer stack may further include electrically conductive materials like carbon or titanium nitride. According to various embodiments, several functional layers may be included in a layer stack, as described herein, wherein the method 100 and method 300, as described herein, may not be influence by additional layers, as long as the surface layer (e.g. the layer being exposed to the plasma treatment) may include the material to be processed.

Figure 2A:
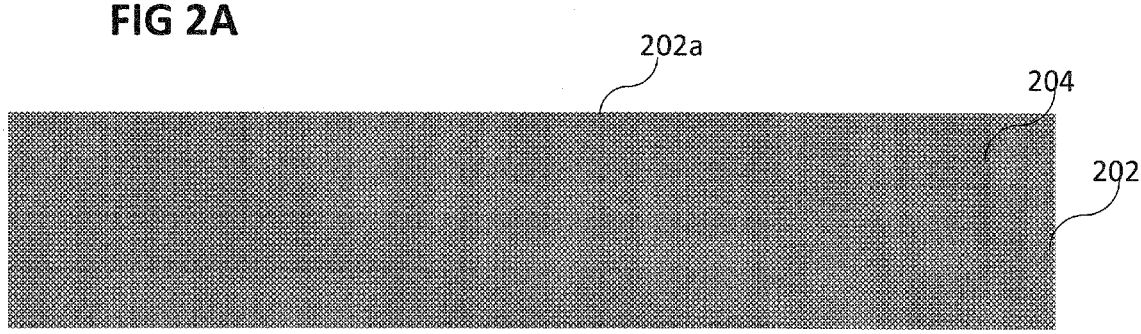
FIGS. 2A and 2B show respectively a schematic cross section of a processed carrier at various processing stages, according to various embodiments.

FIG. 2A shows a schematic cross section of a provided carrier before a plasma treatment (e.g. process 120) is carried out, according to method 100 described referring to FIG. 1. As shown in FIG. 2A, a carrier 202 may be provided including an exposed surface 202a of a material 204 to be processed, according to process 110 of method 100, as shown in FIG. 1. According to various embodiments, the material 204 forming the surface of the carrier 202 may include the same material as carrier 202. In other words, the surface 202a may be the surface of the carrier 202, and the material 204 may be the carrier material. According to various embodiments, the carrier material (and therefore the material 204 to be processed) may be silicon or may at least include silicon. According to various embodiments, the carrier material (and therefore the material 204 to be processed) may be germanium or may at least include germanium.

According to various embodiments, a silicon surface 202a of a silicon wafer 202 may be completely exposed, wherein completely exposed means that no other material may be arranged over the silicon surface 202a or within the silicon surface 202a. According to various embodiments, at least a part 202a of a main processing surface of a silicon wafer may be completely exposed. According to various embodiments, a plasma treatment of the exposed surface 202a (e.g. of the completely exposed silicon surface 202a) may be carried out, as described in the following.

Figure 2B:
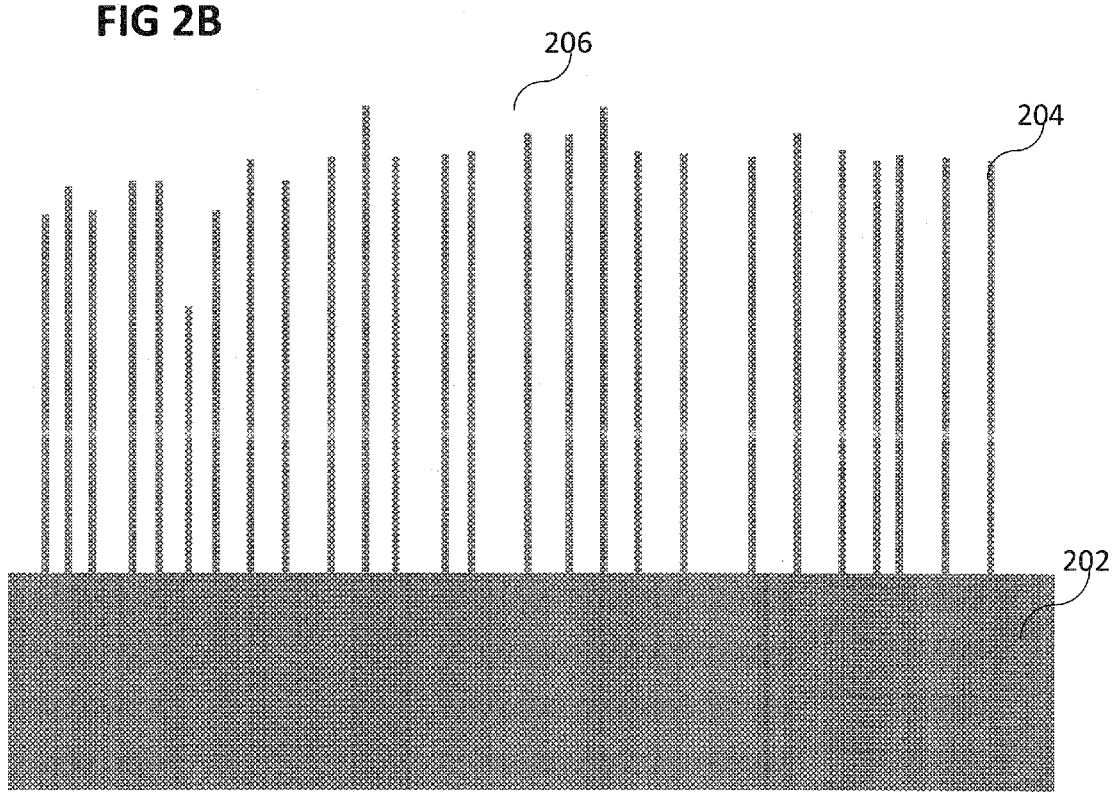

FIG. 2B shows a schematic cross section of a carrier including a plurality of nanowires after a plasma treatment is carried out (e.g. after process 120 is carried out), according to method 100 as described referring to FIG. 1. As shown in FIG. 2B, a plurality of nanowires 206 may be formed from the material 204 to be processed during the plasma treatment, as described referring to process 120 as shown in FIG. 1. According to various embodiments, the plasma treatment may include at least one of the following plasma treatments: plasma etching, reactive ion etching (RIE), magnetically enhanced reactive ion etching (MERIE), and inductively enhanced reactive ion etching.

According to various embodiments, a plasma treatment may be carried out using magnetically enhanced reactive ion etching (MERIE, or a MERIE process). According to various embodiments, a plasma treatment may be carried out using inductively coupled plasma etching (ICP etching, or an ICP process). According to various embodiments, a plasma treatment may be carried out using reactive ion etching (RIE, or a RIE process).

According to various embodiments, depending on the material 204 to be processed, at least one suitable plasma etchant may be selected from the following group of plasma etchants: hydrogen bromide, oxygen, nitrogen trifluoride, sulfur hexafluoride, hydrogen iodide, boron trichloride, chlorine trifluoride, hydrogen chloride (HCl), and carbon tetrafluoride.

According to various embodiments, the material 204 to be processed may be silicon and the plasma etchant which may be used for the MERIE process may be a mixture of hydrogen bromide and oxygen. According to various embodiments, the material 204 to be processed may be silicon and the plasma etchant which may be used for the MERIE process may be a mixture of hydrogen bromide, oxygen and nitrogen trifluoride. Referring to this, according to various embodiments, the MERIE process (the plasma treatment) may be performed using the following parameters: the hydrogen bromide flow may be in the range of about 0 sccm to about 1000 sccm, e.g. in the range of about 0 sccm to about 500 sccm, e.g. in the range of about 50 sccm to about 250 sccm; the oxygen flow may be in the range of about 0 sccm to about 1000 sccm, e.g. in the range of about 0 sccm to about 500 sccm, e.g. in the range of about 10 sccm to about 200 sccm; the nitrogen trifluoride flow may be in the range of about 0 sccm to about 500 sccm, e.g. in the range of about 0 sccm to about 250 sccm, e.g. in the range of 0 sccm to about 50 sccm, e.g. in the range of 25 sccm to about 125 sccm; the pressure (chamber pressure) may be in the range of about 0 mTorr to about 2000 mTorr, e.g. in the range of about 0 mTorr to about 500 mTorr, e.g. in the range of about 50 mTorr to about 150 mTorr, e.g. in the range of about 0 mTorr to about 200 mTorr; the source power during the plasma etching may be in the range of about 0 W to about 10000 W, e.g. in the range of about 0 W to about 5000 W, e.g. in the range of about 0 W to about 2000 W, e.g. in the range of about 0 W to about 1500 W; the bias power may be in the range of about 0 W to about 10000 W, e.g. in the range of about 0 W to about 5000 W, e.g. in the range of about 0 W to about 2000 W, e.g. in the range of about 100 W to about 1500 W (in plasma on mode); the temperature of the carrier (or the chuck temperature) may be in the range of about −100° C. to about 250° C., e.g. in the range of about −100° C. to about 150° C., e.g. in the range of about −50° C. to about 50° C., e.g. in the range of about 20° C. to about 90° C.

As shown in FIG. 2B, a plurality of nanowires (e.g. silicon nanowires) 206 may be formed at least one of over and in the material 204 to be processed, for example at least one of over and in the exposed surface 202a of the carrier (e.g. silicon carrier) 202, after a plasma treatment of the exposed surface (e.g. silicon surface) is carried out, e.g. using the following parameters for the MERIE process: a hydrogen bromide (HBr) flow of about 250 sccm, an oxygen flow of about 100 sccm, a nitrogen trifluoride (NF$_3$) flow of about 30 sccm, a bias power of about 1000 W, a source power of about 1000 W, a chamber pressure of about 100 mTorr, a chuck temperature of about 50° C.

According to various embodiments, the surface of a substrate (e.g. surface 202a of substrate 204) may be increased by a large factor due to the formation of the nanowires. According to various embodiments, the nanowires (e.g. the silicon nanowires) may be used as an electrode for a rechargeable battery, e.g. a lithium-ion battery, since silicon can store lithium-ions at interstitials in the silicon lattice. According to various embodiments, silicon nanowires may have unique properties which may be not comparable with silicon bulk material, as for example, silicon nanowires may store and release lithium-ions reversibly without being damaged by the large expansion of the silicon lattice, while lithium-ions occupy interstitial positions in the silicon lattice.

According to various embodiments, as shown in FIG. 2B, a dense array of nanowires (e.g. a dense array 206 of for example silicon nanowires) may be formed during process 120, which may also be called grass (e.g. silicon grass 206). Depending on the plasma treatment process parameters, e.g. gas flow, total flow, bias power, source power, chuck temperature, and/or pressure, the resulting silicon grass structure may be influenced in a wide range, for example, properties like the density of the nanowires (e.g. the number of nanowires related to the size of the surface area below the nanowires), the length and the diameter of the nanowires, and the shape of the nanowires may be changed or adapted depending on the used parameters for the plasma treatment.

According to various embodiments, all nanowires of the plurality of nanowires may have the same height (not shown in figures). According to various embodiments, at least one nanowire of the plurality of nanowires may have a different height than the other nanowires of the plurality of nanowires. According to various embodiments, the plurality of nanowires 206, as shown in FIG. 2B, may include nanowires having various heights. Referring to this, the height of a nanowire may be equal to the length of the nanowire, if the nanowire is aligned perpendicular to the substrate surface. According to various embodiments, the distance between adjacent nanowires may be in the range of about 0 nm to about 1000 nm, e.g. in the range of about 0 nm to about 100 nm, e.g. in the range of about 10 nm to 50 nm, e.g. in the range of about 10 nm to 30 nm. According to various embodiments, the plurality of nanowires 206, as shown in FIG. 2B, may include a plurality of adjacent nanowires, wherein the distance between adjacent nanowires may vary (e.g. vary around a mean value of about 20 nm). There may be the case, that at least two nanowires may contact each other. According to various embodiments, each nanowire of the plurality of nanowires may have at least a physical connection to the substrate material below.

It may be useful for several applications that nanowires may be formed, wherein the nanowires may include an electrically conductive material or may consist of an electrically conductive material, according to various embodiments. According to various embodiments, a carrier (e.g. a silicon carrier 202 or a silicon wafer 202) may include electrically conductive silicon (e.g. p-type silicon, or n-type silicon). According to various embodiments, the doping of the silicon may be performed before a plasma treatment is carried out (e.g. before process 120 may be carried out). In this case, the carrier including silicon may be doped using ion implantation or thermal diffusion, as described above. According to various embodiments, the doping may also be carried out after a plasma treatment (e.g. after process 120 has been carried out), wherein in this case the nanowires 206 (e.g. the silicon nanowires) may be doped using ion implantation or thermal diffusion, as described before.

According to various embodiments, the nanowires may be covered with another material in a later performed layering process (not shown in figures). According to various embodiments, the nanowires may be covered with a carbon layer in a later performed layering process, e.g. depositing carbon using pyrolytic deposition.

According to various embodiments, a silicon wafer (e.g. carrier 202) may have a specific crystal orientation perpendicular to the main processing surface (e.g. perpendicular to surface 202a, as shown in FIG. 2A). Usually an (100)-, (110)-, or (111)-oriented wafer or substrate may be used. According to various embodiments, the respective silicon nanowires formed directly on a substrate with a specific crystal orientation may have specific physical and chemical properties. According to various embodiments, a (100)-oriented silicon wafer may be used as carrier 202 for applying method 100 as described referring to FIG. 1. According to another embodiment, a (110)-oriented silicon wafer or a (111)-oriented silicon wafer may be used as carrier 202 for applying method 100 as described referring to FIG. 1. According to various embodiments, polycrystalline silicon wafers having sufficiently large grains (e.g. a mean grain size of larger than 100 µm) may be used as carrier (e.g. as carrier 202).

Figure 3:
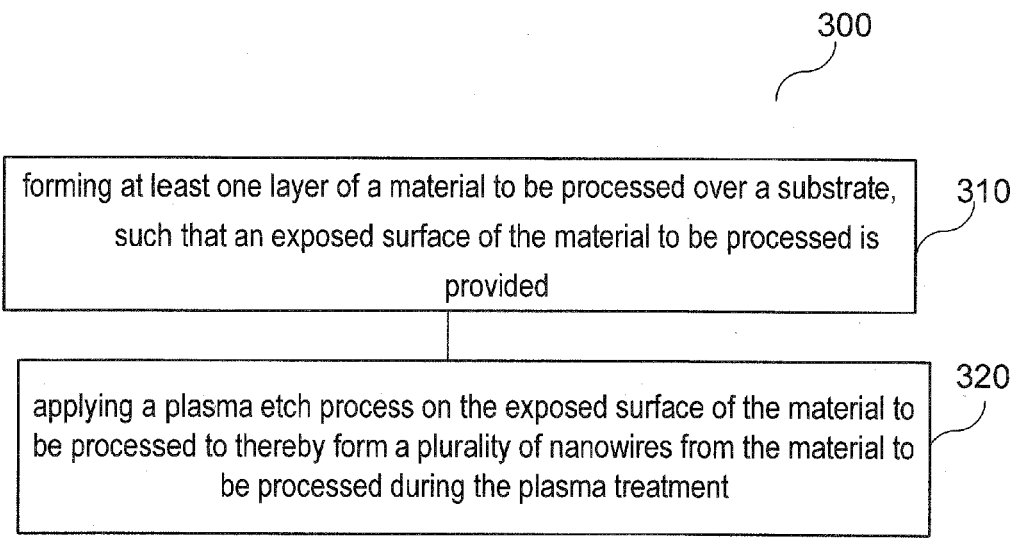
FIG. 3 shows a method for manufacturing a plurality of nanowires in a flow diagram, according to various embodiments.

FIG. 3 shows method 300 for manufacturing a plurality of nanowires in a flow diagram, according to various embodiments, wherein the method includes forming at least one layer of a material to be processed over a substrate (or over a carrier), such that an exposed surface of the material to be processed is provided (in 310); and applying a plasma etch process on the exposed surface of the material to be processed to thereby form a plurality of nanowires from the material to be processed during the plasma treatment (in 320).

According to various embodiments, method 300 can be seen as a modification of method 100, wherein the material to be processed is provided using an additional layer, therefore, the materials and processes described referring to method 100 may be included in method 300 in analogy. Referring to method 300, the selection of the substrate (or the carrier) to be used may not depend on the material to be processed. In other words, the material forming the plurality of nanowires may be selected independently from the substrate material (or from the carrier material).

Figure 4A:

FIG. 4A shows a schematic cross section of a substrate 402 at an initial processing stage, before a plasma treatment is carried out (e.g. before processes 310 and 320 are carried out, according to method 300 as described referring to FIG. 3). As shown in FIG. 4A, a substrate 402 may be provided. According to various embodiments, the substrate (or the carrier) 402 may include the same material or materials as carrier 202 described referring to FIG. 2A. Further, according to various embodiments, the substrate 402 may be any type of suitable substrate, wherein the properties being considered for selecting a specific type of substrate may be for example mechanical properties or for example costs. According to various embodiments, the substrate 402 may be selected depending on the material which may be formed over the substrate 402 in a later layering process (e.g. material 406 as shown in FIG. 4B), wherein the selection of a material combination of a substrate material and a material formed over the substrate (e.g. material 406) may depend on deposition parameters (e.g. deposition temperature) for the material formed over the substrate 402 (e.g. material 406).

Figure 4B:
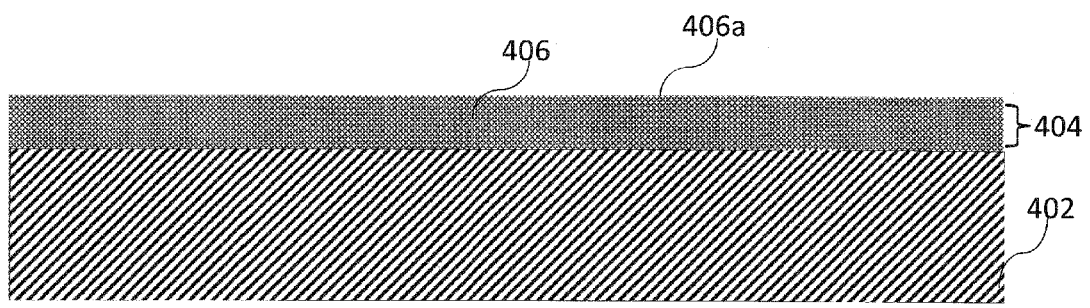

As shown in FIG. 4B, at least one layer 404 may be formed over the substrate 402 including at least one material (e.g. material 406), according to process 310. According to various embodiments, layer 404 may be formed over the substrate 402 using a layering process (e.g. LPCVD, ALCVD), as described above. According to various embodiments, the layer 404 may include at least one of the following materials: silicon, germanium, or carbon. According to various embodiments, the layer 404 may be a silicon layer (e.g. a single crystalline silicon layer or a poly crystalline silicon layer), hence, the material 406 to be processed may be silicon as well.

According to various embodiments, the layer 404 may be an electrically conducting silicon layer, wherein the electrically conducting layer 404 may include for example doped silicon 406. According to various embodiments, the layer 404 may be doped using ion implantation or thermal diffusion of the dopant (doping material), as described before. According to various embodiments, an exposed surface 406a of a material 406 to be processed is provided after the at least one layering process has been carried out forming layer 404, as illustrated in FIG. 4B. According to various embodiments, a substrate or a carrier (e.g. substrate 402) may play a minor role for applying method 300, as described referring to FIG. 3, in other words, as long as the layer 404 may be formed over substrate 402, as shown in FIG. 4B, the properties of the substrate 402 may not be relevant or may be of small relevance for the plasma treatment (e.g. for process 320 of method 300).

According to various embodiments, a silicon layer (e.g. layer 404 or carrier 202) may include silicon in a variety of different microstructures, e.g. single crystalline silicon, e.g. poly crystalline silicon, e.g. poly crystalline silicon, wherein the crystallites may have a random orientation distribution or wherein the crystallites may have a preferential direction.

In analogy to process 120 described herein referring to method 100 in FIG. 1, process 320 may be applied on the exposed surface 406a of the material 406 to be processed. In process 320, a plurality of nanowires 406 may be formed from the material 406 to be processed during the plasma treatment, as shown in FIG. 4C. According to various embodiments, the material 406 of layer 404 may be silicon and the plasma treatment may include a plasma etch process (e.g. MERIE), as described referring to process 120 of method 100.

A modification of method 300 is illustrated in FIG. 4D, according to various embodiments. Thereby, instead of layer 404, as shown and described referring to FIG. 4B, a layer stack 410 may be formed over the carrier 402 using layering processes before the plasma treatment (process 320) is carrier out. According to various embodiments, the layer stack 410 formed over the carrier 402 may include more than one sub-layer which may be formed over the substrate 402 using more than one layering process. According to various embodiments, the layer stack 410 formed over the carrier 402 may include at least one of the following materials: silicon, germanium, carbon, and transition metal nitrides (e.g. titanium nitride, tungsten nitride, tantalum nitride and molybdenum nitride). According to various embodiments, surface layer 412 of the layer stack 410 formed over the carrier 402 may be a silicon layer and a second layer 414 of the layer stack 410 may be formed of another material, as for example titanium nitride or carbon. Since the configuration of the surface layer 412 of the layer stack 410 may be crucial for the plasma treatment which is carried out in process 320, the second layer 414 may be configured to provide a desired functionality (e.g. a chemical functionality, a mechanical functionality, or an electrical functionality). According to various embodiments, the second layer 414 may be configured as barrier layer, e.g. to prevent diffusion of small atoms through layer 414, e.g. second layer 414 may be a titanium nitride layer (or may include another transition metal nitride) to prevent diffusion (e.g. diffusion of lithium-ions from the surface layer 412 into the substrate 402). Since the plurality of nanowires (e.g. the plurality of nanowires 406) may be included into a rechargeable battery (e.g. a lithium-ion battery), according to various embodiments, the second layer 414 may also be an electrically conductive layer to support current flow.

According to various embodiments, the surface layer 412 may have the same properties or may include the same materials as described referring to layer 404 shown in FIG. 4B. According to various embodiments, the substrate 402 may have the same properties or may include the same materials as described referring to carrier 202 shown in FIG. 2A.

According to various embodiments, the layer stack 410 formed over the carrier 402 may include more than two different layers, e.g. three different layers, or even more (not shown in figures), wherein the surface layer may provide the material for forming the plurality of nanowires and the other layers, arranged below the surface layer, may provide a desired additional functionality (e.g. a chemical functionality, a mechanical functionality, or an electrical functionality).

According to various embodiments, a plurality of silicon nanowires may be created by using exclusively a plasma treatment of an exposed silicon surface. It should be noted, that no lithographic process may be necessary for the creation of the nanowires and therefore, method 100 and method 300 may provide a simple and cheap process to create a plurality of nanowires on a carrier or a substrate, e.g. to create a so-called silicon grass (206, 408). During a plasma treatment, as described herein, various chemical and physical processes may occur that may be responsible for the growth or the formation of the silicon nanowires (e.g. ablation of material to be processed due to the plasma treatment, diffusion of material to be processed due to the kinetics of the plasma treatment, re-deposition of removed material to be processed, preferential etching, randomly local masking of the surface, and removal of material, e.g. between the randomly locally masked areas of the surface). According to various embodiments, the kinetic energies of the etchant atoms or etchant ions may change the mobility of the surface atoms or may induce a preferential ablation of surface material which may at least influence or enable the formation of the silicon nanowires.

According to various embodiments, since a plurality of nanowires may be created at least one of over and in a silicon surface, the methods described herein may be integrated in commonly used fabrication processes for integrated circuits. Moreover, only basic processes in semiconductor industry may be necessary to perform method 100 and method 300, according to various embodiments. According to various embodiments, method 100 and method 300 may be used for manufacturing an anode of a battery (e.g. a lithium-ion based battery). According to various embodiments, the silicon nanowires fabricated according to method 100 and method 300, as described herein, may not be affected by the incorporation of lithium-ions (a so-called intercalation process).

It should be noted, that applying method 100 or method 300 increases the surface area of a carrier or a surface layer significantly (e.g. by a factor of 100 or even more), which may generate beneficial electrical properties (e.g. an enlarged storage capacity of lithium-ions), according to various embodiments.

According to various embodiments, the plurality of nanowires may be a part of a battery, e.g. of a rechargeable battery, e.g. a part of a lithium-ion battery. According to various embodiments, the battery may be integrated in an electrical circuit. Further, according to various embodiments, the battery may be formed at least one of over and in a carrier, e.g. a silicon wafer, e.g. a semiconductor substrate, e.g. an arbitrary substrate including a silicon surface.

Figure 5:
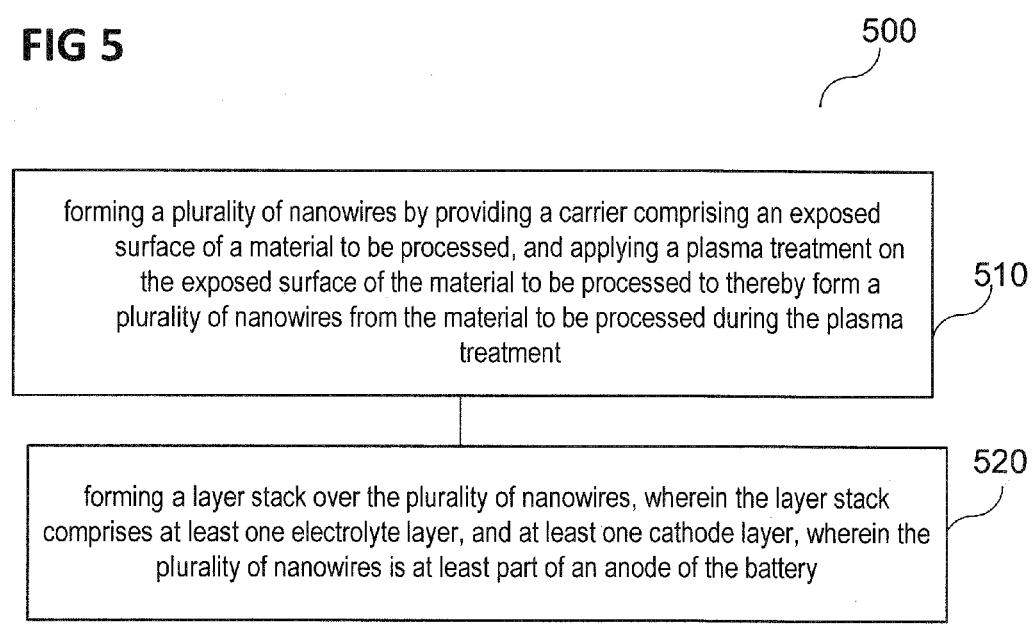
FIG. 5 shows a method for manufacturing a battery including a plurality of nanowires in a flow diagram, according to various embodiments.

As shown in the following, according to various embodiments, a method 500 for manufacturing a battery is provided. As shown in FIG. 5, according to various embodiments, the method for manufacturing a battery may include: forming a plurality of nanowires by providing a carrier including an exposed surface of a material to be processed, and applying a plasma treatment on the exposed surface of the material to be processed to thereby form a plurality of nanowires from the material to be processed during the plasma treatment (in 510); and forming a layer stack over the plurality of nanowires, wherein the layer stack includes at least one electrolyte layer, and at least one cathode layer, wherein the plurality of nanowires is at least part of an anode of the battery (in 520).

According to various embodiments, process 510 as shown in FIG. 5 may include forming a plurality of nanowires, wherein process 510 may at least partially include method 100 or method 300 (e.g. performing processes 110 and 120 or processes 310 and 320). In other words, method 100 or method 300 may be used for manufacturing a plurality of nanowires, wherein the plurality of nanowires may be used for manufacturing a battery, e.g. the plurality of nanowires may be at least part of an anode of a battery. After process 510, e.g. after applying process 110 and 120 referring to method 100, or after applying process 310 and 320 referring to method 300, process 520 may be carried out. Since applying process 520 of method 500 may not depend on, whether method 100 or method 300 is used for providing the plurality of nanowires, method 500 is described in the following for sake of brevity only referring to method 300, as described above. It should be noted, that method 100 may also provide a plurality of nanowires, according to various embodiments, which may be included in a battery, in analogy to the method shown and described in the following.

FIGS. 6A and 6B illustrate a schematic cross section of a carrier 602 at various processing stages while method 500 is carried out, according to various embodiments.

As shown in FIG. 6A, a plurality of nanowires 406 may be formed at least one of over and in a carrier 602, wherein the plurality of nanowires 406 may be formed in accordance with method 300 as described before. Thereby, the plurality of nanowires 406 may include the same basic features, functionalities, and forming the plurality of nanowires 406 may include the same fabrication processes, as described above referring to the plurality of nanowires 204 and 406. According to various embodiments, the nanowires 406 may include silicon or may consist of silicon. According to various embodiments, surface layer 412 of the layer stack 410 formed over the carrier 602 may be a silicon layer and the second layer 414 of the layer stack 410 may be formed of another material, e.g. the second layer 414 of the layer stack 410 formed over the carrier 602 may include a nitride layer, e.g. an electrically conductive nitride layer, e.g. an electrically conductive transition metal nitride layer, e.g. a titanium nitride layer, e.g. a tungsten nitride layer, e.g. a niobium nitride layer, e.g. a molybdenum nitride layer, and the like. According to various embodiments, the second layer 414 of the layer stack 410 formed over the carrier 602 may include various sublayers, wherein at least one sublayer may include at least one material of the following group of materials: a metal, a metal nitride, an electrically conductive nitride, an electrically conductive transition metal nitride, titanium nitride, tungsten nitride, niobium nitride, molybdenum nitride, tantalum nitride, carbon. According to various embodiments, surface layer 412 of layer stack 410 formed over the carrier 602 may be a silicon layer which may have a thickness in the range of about 1 nm to about 100 nm, e.g. in the range of about 5 nm to about 50 nm, e.g. in the range of about 10 nm to about 30 nm. According to various embodiments, surface layer 412 of layer stack 410 formed over the carrier 602 may be a silicon layer which may have a thickness of about 30 nm.

According to various embodiments, the second layer 414 of the layer stack 410 formed over the carrier 602 or at least one sublayer included in the second layer 414 of the layer stack 410 may be electrically conductive. Therefore, this electrically conductive layer or sublayer may serve as current collector in a battery, e.g. in a thin film battery. According to various embodiments, the electrically conductive layer or sublayer (e.g. second layer 414 or a sublayer included in the second layer 414) may serve as current collector and diffusion barrier at the same time, e.g. using a titanium nitride layer or a titanium nitride sublayer.

According to various embodiments, the battery, as described referring to method 500, may be a lithium-ion based battery, and therefore a sublayer of the second layer 414 of the layer stack 410 formed over the carrier 602 may include a carbon sublayer to prevent lithium diffusion into the carrier 602, e.g. by absorbing or storing lithium-ion diffusing through a sublayer serving as diffusion bather layer, which may be arranged over the carbon layer, e.g. a titanium nitride sublayer serving as diffusion bather layer. That means, according to various embodiments, the second layer 414 of the layer stack 410 formed over the carrier 602 may include at least two sublayers, wherein one sublayer may include carbon and one sublayer may include titanium nitride, wherein the carbon sublayer may be arranged below the titanium nitride sublayer.

According to various embodiments, the carrier 602 may have the same properties and may include the same material (or materials) as described above referring to substrate 402 or carrier 202. According to various embodiments, the carrier 602 may be a flexible carrier as for example a polymer substrate or a polyimide substrate (e.g. Kapton).

As shown in FIG. 6B, a layer stack 604 may be formed, e.g. deposited, over the plurality of nanowires 406. According to various embodiments, the layer stack 604 formed over the plurality of nanowires 406 may also cover the surface layer 412 of layer stack 410 formed over the carrier 602. According to various embodiments, the layer stack 604 may include an electrolyte layer 604a, a cathode layer 604b and a cathode current collector layer 604c. According to various embodiments, the layers 604a, 604b, and 604c of the layer stack 604 may be deposited using standard deposition processes in semiconductor industry, e.g. sputtering, e.g. LPCVD, e.g. ALCVD, or other layering processes as described above.

According to various embodiments, electrolyte layer 604a may include or may consist of at least one material of the following group of materials, the group including: lithium, phosphorus, lithium phosphorus oxynitride, a polymer, polyoxyethylene, $LiPO_{1-x}N_{1-y}$.

According to various embodiments, cathode layer 604b may include or may consist of at least one material of the following group of materials, the group including: lithium, cobalt, nickel, aluminium, oxygen, iron, phosphorous, manganese, vanadium, manganese spinel, lithium nickel manganese cobalt, lithium iron phosphate (doped or undoped), olivine, $LiCoO_2$, $LiNiO_2$, $LiNi_{1-x}Co_xO_2$, $LiNi_{0.85}Co_{0.1}Al_{0.05}O_2$, $LiNi_{0.33}Co_{0.33}Mn_{0.33}O_2$, $LiMn_2O_4$ (spinel structure), $LiFePO_4$, $V_2O_5$, $LiMn_2O_4$, and $LiFePO_4$.

According to various embodiments, cathode current collector layer 604c may include or may consist of at least one material of the following group of materials, the group including: an electrically conductive material, a metal, a metal nitride, a transition metal, a transition metal nitride, platinum, copper, aluminium, gold, titanium nitride, vanadium nitride, molybdenum nitride, tantalum nitride.

According to various embodiments, electrolyte layer 604a may not have a smooth surface as shown in FIG. 6B, since the surface structure created by the plurality of nanowires 406 may be at least partially transferred to the electrolyte layer 604a. According to various embodiment, the interfaces (or the boundary layers) between the electrolyte layer 604a and the cathode layer 604b, as well as between the cathode layer 604b and the cathode current collector layer 604c, may not be smooth interface layers as shown in FIG. 6B, since the surface structure (or surface roughness) created by the plurality of nanowires 406 may be at least partially transferred through the electrolyte layer 604a to the cathode layer 604b and the cathode current collector layer 604c (not shown in figures).

Further, according to various embodiments, as shown in FIG. 6C, the layer stack 604 formed over the plurality of nanowires 406 may be covered with at least one protection layer 606, e.g. a polymer layer, e.g. an oxide layer, e.g. a resin layer, and the like.

Further, according to various embodiments, as shown in FIG. 6C, the plurality of nanowires 406 may be covered with an additional carbon layer 608, e.g. by using at least one layering process (e.g. by using a pyrolytic deposition of carbon), before depositing the layer stack 604 over the plurality of nanowires 406 and the carbon layer 608. According to various embodiments, the carbon layer 608 including for example carbon or pyrolytic carbon may improve the electrical and physical properties of the silicon nanowires for storing lithium-ions. According to various embodiments, the carbon layer 608 may fill the regions between the nanowires 406, as shown in FIG. 6C. According to various embodiments, in analogy to FIG. 6B, the layers 608, 604a, 604b, 604c, and 606 may not have smooth surfaces or interfaces as illustrated in FIG. 6C, since the surface structure of the plurality of nanowires 406 may be at least partially transferred to the respective layers formed over the plurality of nanowires 406.

According to various embodiments, the plurality of nanowires 406, as shown in FIG. 6B and FIG. 6C, may be at least part of an anode (or negative electrode) of a battery (e.g. a thin-film battery, e.g. a rechargeable thin-film battery, e.g. a so-called two-dimensional battery, and the like). Further, according to various embodiments, the materials for the electrolyte and the cathode (or positive electrode) may be selected or combined depending on the desired physical and electrical properties. According to various embodiments, the material for the current collectors (e.g. the cathode current collector and the anode current collector) may be selected from the suitable materials to provide the desired electrical conductivity, and the material for the current collectors may be selected depending on the capability of the material to prevent lithium diffusion.

According to various embodiments, several diffusion barrier layers may be deposited during fabrication of the battery 600a, 600b, as described above.

According to various embodiments, the current collector layers (e.g. the cathode current collector layer and the anode current collector layer) may have a thickness in the range of a few nanometers, e.g. 10 nm or even less, up to several micrometers, e.g. 2 µm, 3 µm, 10 µm or even more. According to various embodiments, the current collector layers (e.g. the cathode current collector layer and the anode current collector layer) may have a thickness below 1 µm, depending on the specific electrical resistance.

According to various embodiments, a battery, as shown and described above, may be arranged on both sides of a carrier; that means that a carrier may have a main processing surface (e.g. a front surface) and a back surface which is opposite to the front surface of the substrate. According to various embodiments, a plurality of nanowires may be formed over the main processing surface (e.g. over the front surface) and over the back side surface, e.g. in the same way as described above. Subsequently, a layer stack (e.g. layer stack 604, as shown in FIG. 6B and FIG. 6C) including at least one electrolyte layer (e.g. electrolyte layer 604a), at least one cathode layer (e.g. cathode layer 604b), and at least one cathode current collector layer (e.g. cathode current collector layer 604c) may be formed over the plurality of nanowires 406 which are formed over the main processing surface (e.g. over the front surface) and over the back side surface, wherein the plurality of nanowires 406 are at least part of an anode of the battery and at least one layer is provided below the plurality of nanowires 406 (or e.g. below the layer 412) serving as anode current collector layer (e.g. layer 414 may serve as anode current collector layer). According to various embodiments, the current collector layers of the main processing surface may be electrically connected with the respective current collector layers on the back side of the carrier.

According to various embodiments, the carrier 602 may be an electrically conductive carrier, e.g. the carrier 602 may include or may consist of doped silicon, a metal, a metal alloy, a metal compound, or any other electrically conductive material. According to various embodiments, the carrier 602 may serve as anode current collector.

According to various embodiments, the battery 600a or 600b, fabricated as described above, including the plurality of nanowires 406 may be integrated into an electrical circuit or may be at least part of an integrated circuit.

According to various embodiments, the layer 412 as shown in FIG. 6B and FIG. 6C may include silicon and may be a part of an anode for the battery 600a, 600b. According to various embodiments, the layer 412 may be thin enough (e.g. the thickness of the layer 412 may be smaller than e.g. about 50 nm), to resist a degradation typically occurring in silicon bulk materials, when lithium-ions are intercalated into the silicon lattice. According to various embodiments, the layer 412 and the plurality of nanowires 406, as shown in FIG. 6B and FIG. 6C, may be an anode for a battery or may be a part of an anode for a battery.

According to various embodiments, the layer 412 and the plurality of nanowires 406 as shown in FIG. 6B and FIG. 6C may store lithium-ions without showing a degradation of the anode material during a plurality of charge and discharge cycles (e.g. more than 100 or more than 1000 or even more).

According to various embodiments, a method for manufacturing a plurality of nanowires may include providing a carrier including an exposed surface of a material to be processed; and applying a plasma treatment on the exposed surface of the material to be processed to thereby form a plurality of nanowires from the material to be processed during the plasma treatment.

According to various embodiments, the nanowires may have a diameter in the range of about 10 nm to about 500 nm, e.g. in the range of about 10 nm to about 100 nm.

According to various embodiments, the nanowires may have a length in the range of about 50 nm to about 10 µm, e.g. in the range of about 50 nm to about 10 µm.

According to various embodiments, applying the plasma treatment may include applying plasma etching.

According to various embodiments, applying the plasma treatment may include applying reactive ion etching.

According to various embodiments, applying the plasma treatment may include applying magnetically enhanced reactive ion etching.

According to various embodiments, applying the plasma treatment may include applying inductively enhanced reactive ion etching.

According to various embodiments, the exposed surface of the material to be processed may be free of particles.

According to various embodiments, the exposed surface of the material to be processed may be free of particles used for a catalytical etch process.

According to various embodiments, the exposed surface of the material to be processed may be free of metal particles.

According to various embodiments, the exposed surface of the material to be processed may be free of metal particles used for a catalytical silicon etching.

According to various embodiments, the exposed surface of the material to be processed may be free of masking material (e.g. particles, a soft mask or a hard mask), which means that no masking material (e.g. a patterned photo resist, nitride particles (e.g. SiN particles or TiN particles), oxide particles (e.g. silicon oxide particles)) may be provided to assist the formation of the nanowires.

According to various embodiments, providing the carrier may include providing a silicon wafer.

According to various embodiments, the exposed surface may include a bare silicon surface of a silicon wafer.

According to various embodiments, the carrier may include at least one of a silicon layer, a germanium layer, a titanium nitride layer, and a carbon layer.

According to various embodiments, the carrier may include at least one diffusion bather layer.

According to various embodiments, the carrier may include a titanium nitride (or another rare earth nitride or transition metal nitride, e.g. tungsten nitride, molybdenum nitride, lanthanum nitride, tantalum nitride, and the like) bather layer.

According to various embodiments, the material to be processed may include at least one of silicon and germanium.

According to various embodiments, applying the plasma treatment may include using at least one of hydrogen bromide, oxygen, and nitrogen trifluoride (e.g. using at least one of hydrogen bromide, oxygen, and nitrogen trifluoride as plasma etchant).

According to various embodiments, the exposed surface of the material to be processed may be an exposed surface of the carrier.

According to various embodiments, the carrier may be a pure silicon wafer.

According to various embodiments, the plurality of nanowires may be formed at least one of over and in the material to be processed, for example at least one of over and in the exposed surface of the material to be processed.

According to various embodiments, a silicon grass may be formed at least one of over and in the material to be processed, for example at least one of over and in the exposed surface of the material to be processed.

According to various embodiments, at least part of the plurality of nanowires may form a self-assembled (or self-aligned) array of nanowires at least one of over and in the material to be processed, for example at least one of over and in the exposed surface of the material to be processed.

According to various embodiments, at least part of the plurality of nanowires may be irregularly distributed at least one of over and in the material to be processed, for example at least one of over and in the exposed surface of the material to be processed.

According to various embodiments, at least part of the plurality of nanowires may be aligned perpendicular (or at least substantially perpendicular) to the exposed surface of the material to be processed.

According to various embodiments, a method for manufacturing an array of nanowires may include forming at least one layer of a material over a substrate (or carrier), such that an exposed surface of a material to be processed is provided; and applying a plasma etch process on the exposed surface of the material to be processed to thereby form a plurality of nanowires from the material to be processed during the plasma treatment.

According to various embodiments, the substrate (or carrier) may include an integrated circuit.

According to various embodiments, forming the at least one layer over the substrate may include at least one layering process.

According to various embodiments, forming the at least one layer over the substrate may include depositing at least one of silicon, carbon, titanium nitride and germanium.

According to various embodiments, forming the at least one layer over the substrate may include forming a layer stack over the substrate, wherein the layer stack formed over the substrate may include at least one of a silicon layer, a germanium layer, a titanium nitride layer, and a carbon layer.

According to various embodiments, the layer stack formed over the substrate may include at least one diffusion barrier layer.

According to various embodiments, the layer stack formed over the substrate may include a titanium nitride (or another rare earth nitride or transition metal nitride, e.g. tungsten nitride, molybdenum nitride, lanthanum nitride, tantalum nitride, and the like) barrier layer.

According to various embodiments, a method for manufacturing a plurality of nanostructures may include providing a wafer including an exposed surface area to be processed, wherein the surface area includes a material to be processed; and applying a plasma etching on the exposed surface and thereby form a plurality of nanostructures from the material to be processed during the plasma etching.

According to various embodiments, a method for manufacturing a plurality of nanostructures may include providing a wafer including an exposed surface area to be processed, wherein the surface area includes a material to be processed; and applying a reactive ion etching (or a magnetically enhanced reactive ion etching) on the exposed surface and thereby form a plurality of nanostructures from the material to be processed during the reactive ion etching (or a magnetically enhanced reactive ion etching).

According to various embodiments, the plurality of nanostructures may include a plurality of at least one of nanowires, nanotubes, and nanopillars.

According to various embodiments, the material of the exposed surface area to be processed may include a semiconductor material.

According to various embodiments, the material of the exposed surface area to be processed may include at least one of silicon, germanium, and carbon.

According to various embodiments, the exposed surface area may have at least an area of about $0.01$ mm$^2$, e.g. a rectangular area with a dimension 0.1 mm times 0.1 mm.

According to various embodiments, a method for manufacturing a battery may include: forming a plurality of nanowires by providing a carrier including an exposed surface of a material to be processed, and applying a plasma treatment on the exposed surface of the material to be processed to thereby form a plurality of nanowires from the material to be processed during the plasma treatment; and forming a layer stack over the plurality of nanowires, wherein the layer stack includes at least one electrolyte layer, at least one cathode layer, and at least one cathode current collector layer, wherein the plurality of nanowires is at least part of an anode of the battery.

According to various embodiments, an anode current collector layer may be arranged below the plurality of nanowires.

According to various embodiments, the method for manufacturing a battery may further include forming an anode current collector layer below the plurality of nanowires.

According to various embodiments, a carbon layer may be arranged between the plurality of nanowires and the electrolyte layer of the layer stack.

According to various embodiments, the method for manufacturing a battery may further include forming a carbon layer between the plurality of nanowires and the electrolyte layer of the layer stack.

According to various embodiments, the layer stack may provide a part of a lithium-ion based rechargeable battery.

According to various embodiments, forming the layer stack over the plurality of nanowires may include forming the layer stack as part of a lithium-ion based rechargeable battery.

According to various embodiments, forming the layer stack over the plurality of nanowires may include forming the layer stack as part of a lithium-ion based rechargeable battery including at least an electrolyte region and a cathode region.

According to various embodiments, the layer stack including at least one electrolyte layer, at least one cathode layer, and at least one cathode current collector layer may be formed over the plurality of nanowires, wherein the plurality of nanowires is at least part of an anode of the battery and at least one layer is provided below the plurality of nanowires serving as anode current collector layer.

According to various embodiments, no lithography or other masking technique may be required for manufacturing the plurality of nanowires. According to various embodiments, manufacturing the plurality of nanowires may be cheap and simple using for example method 100 or method 300, as described above. According to various embodiments, the aspect ratio of the nanowires may be tunable by process parameters of the plasma treatment. According to various embodiments, an integration of nanowires into electrical circuits (or e.g. integrated circuits) may be possible.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A method for manufacturing a plurality of nanowires, the method comprising:
    forming a diffusion barrier layer over a carrier, the diffusion barrier layer comprising a nitride and the carrier comprising silicon;
    forming a silicon layer over the diffusion barrier layer, such that an exposed surface of the silicon layer is provided;
    applying a plasma treatment on the exposed surface of the silicon layer to thereby form a plurality of nanowires from the silicon layer during the plasma treatment.

2. The method according to claim 1,
    wherein the nanowires of the plurality of nanowires have a diameter in the range from about 10 nm to about 100 nm.

3. The method according to claim 1,
    wherein the nanowires of the plurality of nanowires have a length in the range from about 50 nm to about 10 µm.

4. The method according to claim 1,
    wherein applying the plasma treatment comprises applying plasma etching.

5. The method according to claim 1,
    wherein applying the plasma treatment comprises applying reactive ion etching.

6. The method according to claim 5,
    wherein applying the plasma treatment comprises applying magnetically enhanced reactive ion etching.

7. The method according to claim 5,
    wherein applying the plasma treatment comprises applying inductively enhanced reactive ion etching.

8. The method according to claim 1,
    wherein applying the plasma treatment comprises using at least one of hydrogen bromide, oxygen, nitrogen trifluoride, sulfur hexafluoride, hydrogen iodide, boron trichloride, chlorine trifluoride, hydrogen chloride, and carbon tetrafluoride as plasma etchant.

9. The method according to claim 1,
    wherein the nanowires of the plurality of nanowires are aligned substantially perpendicular to the exposed surface of the silicon layer.

10. The method according to claim 1,
    wherein the carrier comprises an integrated circuit.

11. A method for manufacturing a plurality of nanostructures, the method comprising:
    providing a wafer wherein a layer stack is provided over the wafer, the layer stack comprising a material to be processed and an electrically conductive nitride diffusion barrier layer that is disposed between the material to be processed and the wafer, wherein the material to be processed is exposed in a surface area, applying a plasma etching on the exposed surface area, thereby forming a plurality of nanostructures from the material to be processed during the plasma etching.

12. The method according to claim 11,
    wherein the nanostructures comprises at least one of nanowires, nanotubes and nanopillars.

13. The method according to claim 11,
    wherein the material of the exposed surface area to be processed comprises silicon.

14. A method for manufacturing a battery, the method comprising:
    forming a diffusion barrier layer over a carrier, wherein the diffusion barrier layer is configured to prevent diffusion of lithium-ions into the carrier;
    forming at least one layer of a material to be processed over the diffusion barrier layer, such that an exposed surface of the material to be processed is provided; and
    applying a plasma treatment on the exposed surface of the material to be processed to thereby form a plurality of nanowires from the material to be processed during the plasma treatment; and
    forming a layer stack over the plurality of nanowires, wherein the layer stack comprises at least one electrolyte layer, at least one cathode layer, and at least one cathode current collector layer, wherein the plurality of nanowires is at least part of an anode of the battery.

15. The method according to claim 14,
    wherein the diffusion barrier layer is further configured as an anode current collector layer.

16. The method according to claim 14, further comprising:
    forming a carbon layer between the plurality of nanowires and the electrolyte layer of the layer stack.

17. The method according to claim 14,
    wherein the layer stack provides a part of a lithium ion based rechargeable battery.

18. The method according to claim 14,
    wherein the material to be processed comprises silicon.

19. The method according to claim 14,
wherein forming the at least one layer of a material to be processed over the diffusion barrier layer comprises forming a silicon layer having a thickness of less than 100 nm.

20. The method according to claim 14,
wherein the material to be processed comprises doped silicon.

21. The method according to claim 14,
wherein the diffusion barrier layer comprises an electrically conductive nitride.

22. The method according to claim 21,
wherein the electrically conductive nitride comprises at least one of a rare earth nitride and a transition metal nitride.

23. The method according to claim 21,
wherein the electrically conductive nitride comprises titanium nitride.

24. The method according to claim 14,
wherein the plasma etch process is carried out so that a portion of the material to be processed remains over the diffusion barrier layer after the plasma etch process has been carried out.

25. The method according to claim 24,
wherein the portion of the material to be processed that remains over the diffusion barrier layer has a thickness of less than 50 nm.

* * * * *